United States Patent [19]
Gilbreath et al.

[11] 3,959,665
[45] May 25, 1976

[54] LOGIC CIRCUITS WITH INTERFACING SYSTEM

[75] Inventors: Jim A. Gilbreath; Robert P. Crabb, both of San Diego; Robert A. Unger, El Cajon, all of Calif.

[73] Assignee: The United States of America as represented by the Secretary of the Navy, Washington, D.C.

[22] Filed: May 29, 1974

[21] Appl. No.: 474,278

[52] U.S. Cl. .............................. 307/208; 307/214; 307/215; 307/270; 307/DIG. 1
[51] Int. Cl.² .................. H03K 19/08; H03K 19/40
[58] Field of Search .......... 307/208, 215, 218, 270, 307/214, DIG. 1, 205; 328/263, 167

[56] References Cited
UNITED STATES PATENTS

| | | | |
|---|---|---|---|
| 3,153,205 | 10/1964 | Jones et al. | 340/258 C X |
| 3,329,835 | 7/1967 | D'Agostino | 307/208 X |
| 3,508,224 | 4/1970 | Putterman | 307/270 X |
| 3,573,497 | 4/1971 | Kraybill | 307/237 |
| 3,675,144 | 7/1972 | Zuk | 307/205 X |

OTHER PUBLICATIONS

Jenkins, "Interface Circuits Drive High-Level Switches from Low-Level Inputs;" Electronic Engineering (pub.); 5/1971; pp. 45-49.

Av-ron et al., "Unipolar/Bipolar Pulse Generator and Amplifier;" IBM Tech. Discl. Bull.; Vol. 14, No. 3, 8/1971; pp. 745-746.

*Primary Examiner*—John S. Heyman
*Assistant Examiner*—Larry N. Anagnos
*Attorney, Agent, or Firm*—Richard S. Sciascia; Ervin F. Johnston; John Stan

[57] ABSTRACT

A driving logic circuit having input and output terminals and first and second power terminals is described in combination with an interfacing means for making the driving logic circuit compatible with a driven logic circuit. This is accomplished by providing a first D.C. power source means which is connected across the first and second power terminals, and a second D.C. power source means which is connected in opposition to the first D.C. power means. With this arrangement the D.C. power to the power terminals is shifted to the extent of the voltage of the second D.C. power source means so as to be made compatible with the driving voltages required to drive the driven logic circuit.

8 Claims, 3 Drawing Figures

TYPICAL TTL INVERTER CIRCUIT

TYPICAL UNIVAC INVERTER CIRCUIT.

LOGIC CIRCUITS WITH INTERFACING SYSTEM

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

In building computer systems it is common place to interface various computer components, such as one computer to another, and/or various peripheral equipment to a computer. This interfacing is accomplished by an intermediary electronic circuit which is generically referred to as interfacing equipment.

A special problem exists in interfacing logic circuitry of the newer computers with logic circuitry of the computers of the 1960 era. The newer microelectric logic circuitry normally operates between ground and a power supply voltage of +5 volts, and the logical levels are nominally +0.2 volts for a 0 and +3.3 volts for a 1. This is in contrast to the 1960 era discrete component logic circuits where logic levels are typically −0.1 volts for a 0 and −3.2 volts for a 1. In the past the method for interfacing these newer and older circuits has consisted of an intermediary electronics circuit called a level shifter. A lever shifter consists of discrete components, such as several transistors, resistors, etc. which require considerable additional power and space. Further disadvantages are that the impedance levels are usually high so that the circuits are susceptible to noise and additional propagation delays are introduced.

STATEMENT OF THE INVENTION

There has been a need for a simple means for interfacing the newer microelectric positive logic circuits to the older discrete component negative logic circuits, thus eliminating the requirement of a level shifter which requires undue additional power and space. For a driving logic circuit having input and output terminals and first and second power terminals, this has been accomplished by providing a first D.C. power source means which is connected across the first and second power terminals, and a second D.C. power source means which is connected in opposition to the first D.C. power source means. With this arrangement, the application of D.C. power to the power terminals of the driving logic circuit is shifted to the extent of the voltage of the second D.C. power source means and made compatible with the driving voltages required to drive the driven logic circuit. Accordingly, the output of a driving logic circuit of the newer type can be shifted from +0.2 volts for a 0 and +3.3 volts for a 1 to −0.1 volts for a 0 and −3.2 volts for a 1. This then makes the output voltages of the newer driving logic circuit compatible with the required input for the older driven logic circuit without the requirement of the typical level shifter.

STATEMENT OF THE OBJECTS OF THE INVENTION

An object of the present invention is to overcome the aforementioned problems associated with interfacing the newer microelectronic positive logic circuits with the older discrete component negative logic circuits.

Another object is to provide a simple, low power, and compact means of interfacing microelectronic positive logic circuits to discrete component negative logic circuits.

A further object is to provide a driving logic circuit and a driven logic circuit which are interfaced by simply a power source means.

Yet another object is to provide a driving logic circuit and a driven logic circuit which are interfaced by simply a power source means and which are decoupled from high and low frequency noise.

These and other objects of the invention will become more readily apparent from the drawing when taken with the ensuing specification.

DESCRIPTION OF THE PREFERRED EMBODIMENT

Figure 1:
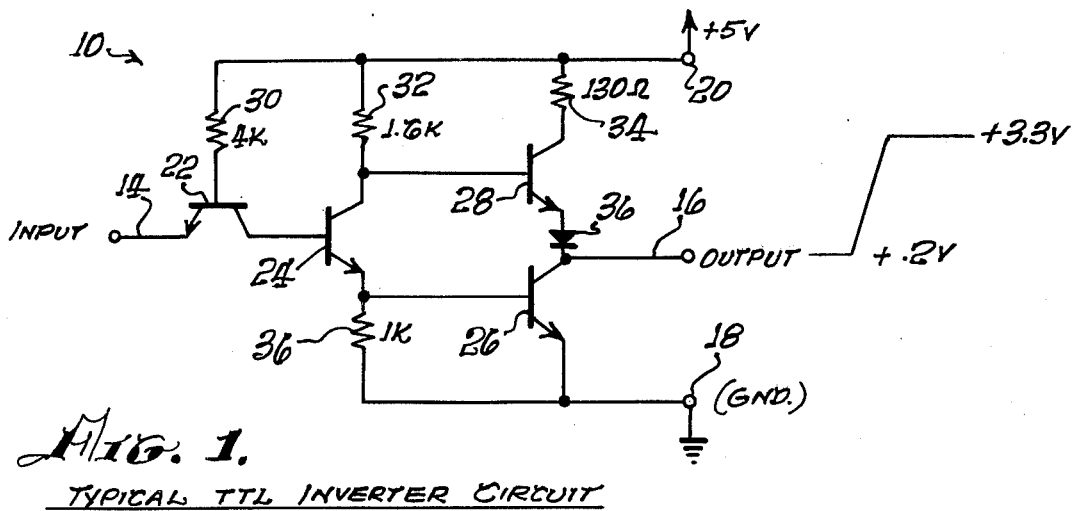
FIG. 1 is a schematic illustration of a typical transistor-transistor-logic (TTL) circuit of the newer type which has positive output signals.

Referring now to the drawing wherein like reference numerals designate like or similar parts throughout the several views there is illustrated in FIG. 1 a typical transistor-transistor-logic (TTL) inverter circuit 10. This circuit is the newer type which is designed to operate on logical levels of +0.2 volts for a 0 and +3.3 volts for a 1. The problem is in interfacing this circuit, which operates with positive logic levels, with the older logic circuits which operate on negative levels and which is illustrated by the typical Univac circuit 12 in FIG. 2.

Referring now to FIG. 1, the newer logic inverter circuit 10 typically includes input and output terminals 14 and 16 respectively, and first and second power terminals 18 and 20, respectively. The power terminals 18 and 20 of the circuit are typically biased at ground and +5 volts respectively, which produces a +0.2 volts (0) and a +3.3 volts (1) at the output 16 for a corresponding 1 and 0 signal at the input 14. As illustrated, the logic circuit 10 may include first, second, third, and fourth transistors 22, 24, 26, and 28, respectively. The first transistor 22 has its emitter connected to the input terminal 14, its base connected to the first power terminal 18, and its collector connected to the base of the second transistor 24. The second transistor may have its emitter connected to the first power terminal 18 as well as the base of the third transistor 26, and its collector connected to the second power terminal 20 as well as the base of the fourth transistor 28. The third transistor 26 may have its emitter connected to the first power terminal 18 and its collector connected to the output terminal 16. The fourth transistor 28 may have its emitter connected to the output terminal 16 and its collector connected to the second power terminal 20. The base of the first transistor 22, the collector of the second transistor 24, and the collector of the fourth transistor 28 may be connected via respective resistors 30, 32, and 34 to the second power terminal 20. The emitter of the second transistor 24 may be connected via a resistor 36 to the first power terminal 18. The emitter of the fourth transistor 28 may be connected via a diode 36 to the output terminal 16.

Figure 2:
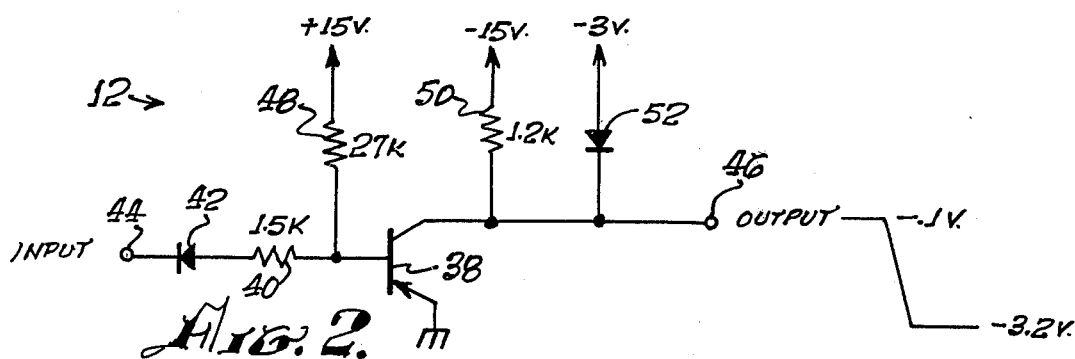
FIG. 2 is a schematic illustration of a typical Univac circuit which is of the older type and which operates on logical levels which are negative.

Referring now to FIG. 2, the older type logic inverter circuit 12 may include a transistor 38 which has its base connected via a resistor 40 and a diode 42 to an input terminal 44. The emitter of the transistor 38 may be connected to ground, and the collector may be connected to an output terminal 46. As illustrated, components such as resistor 50, and diode 52 may be connected in the line between the input and output terminals 44 and 46 for clamping purposes. This circuit typically operates on an input and output of −0.1 volts for a 0 and −3.2 volts for a 1. It can now readily be seen that because of the different logic levels of the two circuits illustrated in FIGS. 1 and 2 that there is an interfacing problem.

Figure 3:
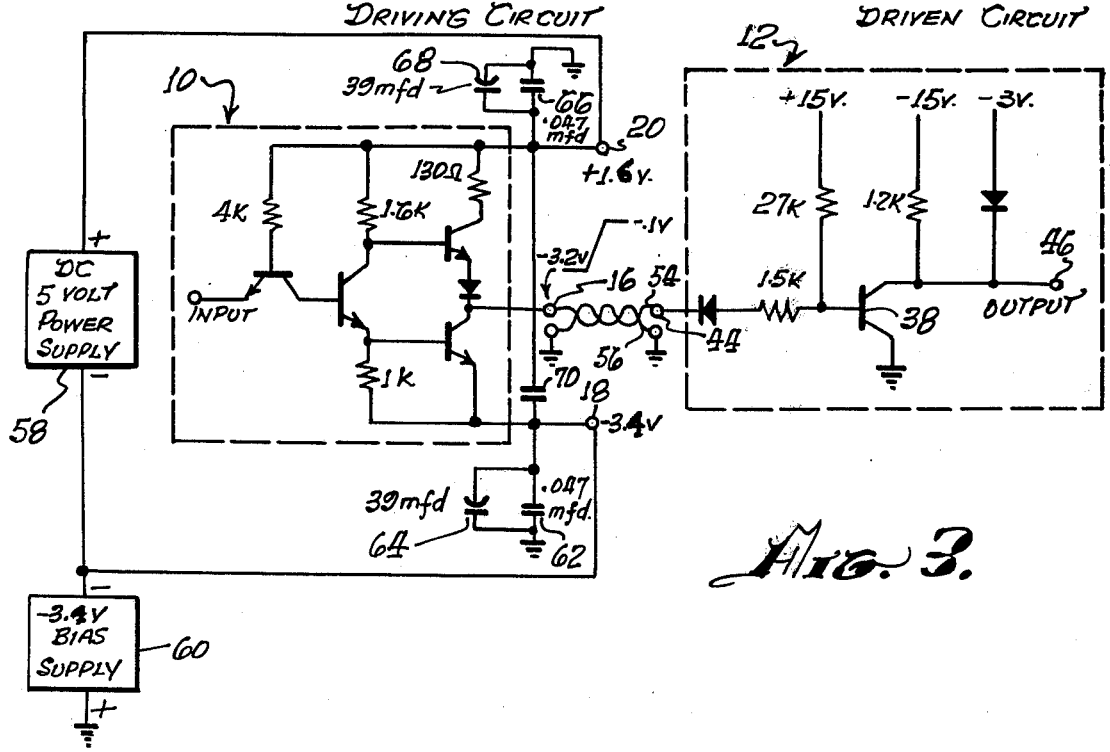
FIG. 3 is a schematic illustration of the circuits of FIGS. 1 and 2 which are interfaced according to the teachings of the present invention.

Referring now to FIG. 3, there is illustrated an interfacing of the newer logic circuit 10 to the older type logic circuit 12 according to the present invention. The output terminal 16 of the newer circuit 10 may be connected to the input terminal 44 of the older type circuit by a lead 54. This lead may be twisted with a ground lead 56 to provide a low impedance transmission line between the two circuits. The normal logic level of the circuit 10 is shifted by a first D.C. power source means, such as a 5 volt D.C. power supply 58, which has its negative side connected to the first power terminal 18 and its positive side connected to the second power terminal 20; and a second D.C. power source means, such as a −3.4 volt D.C. bias supply 60 which has its negative side connected to both the first power terminal 18 and the negative side of the 5-volt power supply 58. According to this arrangement, a −3.4 volts is applied to the first power terminal 18 and a +1.6 volts is applied to the second power terminal 20. This then causes the circuit 10 to provide an output of −0.1 volts for a 0 and a −3.2 volts for a 1 which is compatible with the input requirements of the older logic circuit 12.

In order to decouple the circuit 10 from any power supply noise a pair of capacitors 62 and 64 may be connected in parallel between the first power terminal 18 and ground, and another pair of capacitors 66 and 68 may be connected in parallel between the second power terminal 20 and ground. The capacitors 62 and 66 are of low capacitance, such as 0.47 mfd, and the capacitors 64 and 68 are of a large capacitance such as 39 mfd. With this arrangement the power terminals 18 and 20 have a very low impedance to ground for both high and low frequency noise. A capacitor 70 may be connected between the first and second power terminals 18 and 20 simply for the purpose of decoupling these terminals for noise therebetween.

While the inverter circuit 10 has been illustrated as a driving circuit and the inverter circuit 12 has been illustrated as a driven circuit it should be understood that the roles can be reversed, that is the circuit 10 can be the driven circuit and the circuit 12 can be the driving circuit. This is accomplished simply by inputting the signals at terminal 46 of the circuit 12.

It is now readily apparent that the present invention provides a unique, low power, and compact means of interfacing the old and new types of logic circuits. The present invention eliminates the need for the ordinary level shifter which includes components which consume undue power and additional space.

Obviously, many modifications and variations of the present invention are possible in the light of the above teachings, and, it is therefore to be understood that within the scope of the disclosed inventive concept, the invention may be practiced otherwise than specifically described.

What is claimed is:

1. In a driving logic circuit having input and output terminals and first and second power terminals, an interfacing means for making the driving logic circuit compatible with a driven logic circuit comprising:
   a first D.C. power source means which is connected across the first and second power terminals; and
   a second D.C. power source means connected in opposition to the first D.C. power source means,
   whereby the application of D.C. power to the power terminals is shifted to the extent of the voltage of the second D.C. power source means and made compatible with the driving voltages required to drive the driven logic circuit.

2. A combination as claimed in claim 1 including:
   a pair of high and low valued capacitors connected between the first power terminal and ground; and
   a second pair of high and low valued capacitors connected between the second power terminal and ground;
   whereby the power terminals are insulated from both high and low frequency noise.

3. A combination as claimed in claim 1 including:
   the first D.C. power source means being 5 volts and the second D.C. power source means being 3.4 volts; and
   the positive side of the first D.C. power source means being connected to the second power terminal means, and the negative side of the second D.C. power source means being connected to both the first power terminal and the negative side of the first D.C. power source means,
   whereby −3.4 volts is applied to the first power terminal and +1.6 volts is applied to the second power terminal.

4. A combination as claimed in claim 3 wherein the driving logic circuit includes:
   first, second, third and fourth transistors;
   the first transistor having its emitter connected to the input terminal, its base connected to the second power terminal and its collector connected to the base of the second transistor;
   the second transistor having its emitter connected to the first power terminal as well as the base of the third transistor, and its collector connected to the second power terminal as well as the base of the fourth transistor;
   the third transistor having its emitter connected to the first power terminal and its collector connected to the output terminal; and
   the fourth transistor having its emitter connected to the output terminal and its collector connected to the second power terminal.

5. A combination as claimed in claim 4 including:
   said driven logic circuit;
   the driven logic circuit having an input terminal and an output terminal;
   the output terminal of the driving logic circuit being connected to the input terminal of the driven logic circuit.

6. A combination as claimed in claim 5 including:
   the base of the first transistor, the collector of the second transistor and the collector of the fourth transistor being connected via respective resistors to the second power terminal; and the emitter of the second transistor being connected via a resistor to the first power terminal, so that the outputs of the driving logic circuit are established at the levels of −0.1 volts and −3.2 volts which are compatible with the logic input levels of the driven logic circuit.

7. A combination as claimed in claim 6 including:

a pair of high and low valued capacitors connected between the first power terminal and ground; and a second pair of high and low valued capacitors connected between the second power terminal and ground;

whereby the power terminals are insulated from both high and low frequency noise.

8. The combination according to claim 1, wherein the driving circuit drives the driven circuit by means of a pair of twisted leads, one lead being a ground lead, the pair of leads providing a low impedance transmission line between the two circuits.

* * * * *